United States Patent [19]

Sakuma et al.

[11] Patent Number: 4,660,068

[45] Date of Patent: Apr. 21, 1987

[54] SUBSTRATE STRUCTURE OF SEMICONDUCTOR DEVICE AND METHOD OF MANUFACTURING THE SAME

[75] Inventors: Kazuhito Sakuma, Ebina; Yoshinobu Arita; Masaaki Sato, both of Isehara; Nobuyoshi Awaya, Zama, all of Japan

[73] Assignee: Nippon Telegraph & Telephone Corporation, Tokyo, Japan

[21] Appl. No.: 525,570

[22] Filed: Aug. 22, 1983

[30] Foreign Application Priority Data

Aug. 24, 1982 [JP] Japan ................... 57-145471

[51] Int. Cl.$^4$ ............................................ H01L 27/12
[52] U.S. Cl. ......................................... 357/49; 357/55
[58] Field of Search ............................ 357/49, 47, 55

[56] References Cited

U.S. PATENT DOCUMENTS 4,331,708  5/1982  Hunter ............................. 357/49
4,502,913  3/1985  Lechaton et al. .................. 357/49
4,509,249  4/1985  Goto et al. ........................ 357/49

FOREIGN PATENT DOCUMENTS 0048175   3/1982   European Pat. Off. ........... 357/55
0050636  10/1978   Japan .
0045675  12/1978   Japan ................................. 357/49
0157044   5/1980   Japan .

Primary Examiner—Martin H. Edlow
Attorney, Agent, or Firm—Charles E. Pfund

[57] ABSTRACT

A substrate structure utilized to fabricate a semiconductor device is constituted by a silicon substrate; an element region selectively formed on the silicon substrate and a relatively thick field oxide region formed adjacent to the element region; an element isolating region formed between the element region and the field oxide region, the element isolating region being in direct contact with the field oxide region; the element isolating region being provided with a relatively deep groove formed in the silicon substrate and having a relatively small width; a silicon oxide insulating film formed on the inner wall of the groove; and a silicon nitride insulating film disposed on the silicon oxide insulating film. The surfaces of the element region, the element isolating region and the field oxide region on the silicon substrate are formed substantially flat.

6 Claims, 28 Drawing Figures

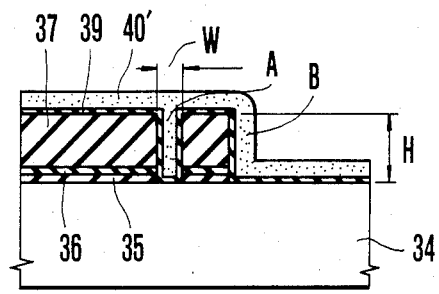
F I G. 4a
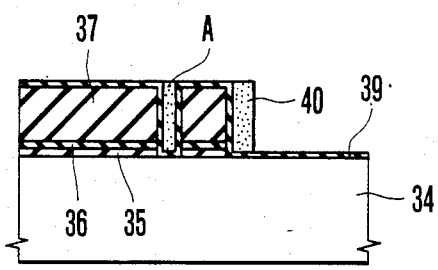
F I G. 4b
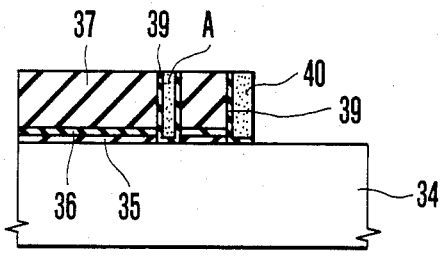
F I G. 4c
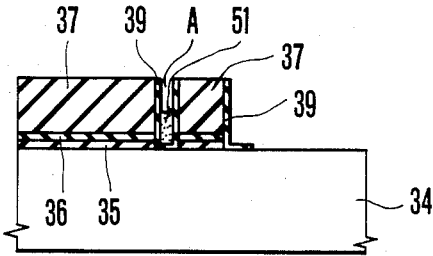
F I G. 4d
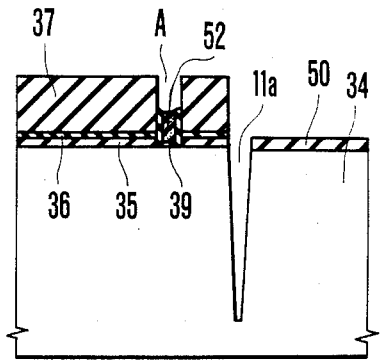
F I G. 4e
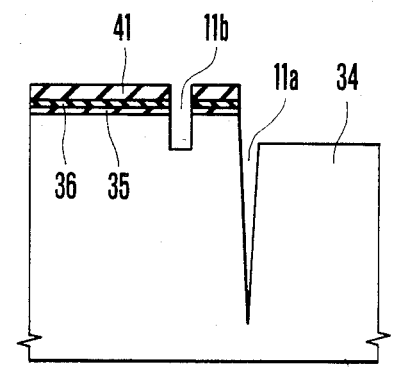
F I G. 4f
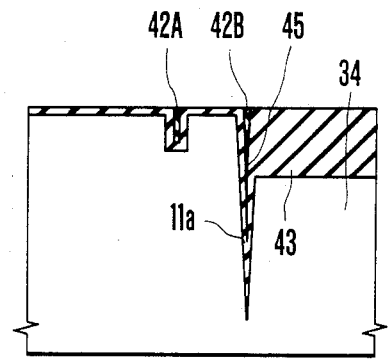
F I G. 4g

SUBSTRATE STRUCTURE OF SEMICONDUCTOR DEVICE AND METHOD OF MANUFACTURING THE SAME

BACKGROUND OF THE INVENTION

This invention relates to a substrate structure of a semiconductor device especially an integrated circuit semiconductor device in which a plurality of semiconductor elements are incorporated into a single semiconductor substrate, and a method of manufacturing the substrate structure.

As a method of insulating and isolating elements of an integrated circuit, a method of selective oxidation has been used which selectively thermally oxidizes the peripheries of the elements. Various methods have also been proposed in which grooves are formed about the elements and the grooves are filled with dielectric. With the selective oxidation method, for example, in the case of a bipolar LSI process, it is necessary to completely isolate epitaxially grown parts with oxide films. But this process requires thermal oxidation over a long time so that redistribution of impurities degrades the performance of the elements. Furthermore, at the time of selective oxidation, bird's beak and bird's head are formed which prevents formation of integrated circuits of high density.

On the other hand, according to a prior art method in which a groove is formed for the purpose of insulating and isolating elements, and the groove is then filled with dielectric, only a narrow isolating region having a constant width can be formed. For this reason it has not been proposed to make a substrate of a semiconductor device in which a thick field oxidized region for wiring is in direct contact with the isolating groove.

When one attempts to form a thick field oxide region adjacent to the prior art isolating groove, it is necessary to use an additional photolithographic process which complicates the process steps. Considering a margin for mask alignment, as it is impossible to form a field oxide film free from any bird's beak and bird's head, in direct contact with the groove, the surfaces of the groove and the field oxide region would be at different levels. The failing to obtain a substrate having a flat surface. Moreover some bird's beak and bird's head remain making it difficult to fabricate an integrated circuit at a high density. Further, according to the prior art groove isolation, since the pattern of the groove is formed by the conventional light exposure technique it is impossible to realize a groove width of a dimension smaller than the limit of the light exposure technique. This also decreases the density of integration. Where the width of the isolating groove is increased, the groove is not completely filled with dielectric with the result that it has been impossible to obtain a substrate having a flat surface.

SUMMARY OF THE INVENTION

Accordingly a principal object of this invention is to provide a novel substrate structure of a semiconductor device having a higher density of integration than a prior art integrated circuit device by improving the element isolating characteristic and a method of manufacturing such novel substrate structures.

Another object of this invention is to provide a substrate structure having a thick field oxidized region and a flat semiconductor substrate surface, and a method of manufacturing such substrate structure.

Still another object of this invention is to provide a method of manufacturing a substrate structure of a semiconductor device capable of simplifying the manufacturing steps of preparing a semiconductor substrate having a field oxidized region.

Another object of this invention is to provide a method of manufacturing a substrate structure of a semiconductor device capable of simplifying the manufacturing steps of the semiconductor substrate having a field oxide region.

Yet another object of this invention is to provide a substrate structure of a semiconductor device capable of withstanding severe environment conditions, and a method of manufacturing such substrate structures.

Still another object of this invention is to provide a substrate structure of a semiconductor device having lesser number of defects in the element regions caused by the stress in the isolating groove and the field oxide region and a method of manufacturing such substrate structures.

Briefly stated, these and other objects can be accomplished according to this invention wherein grooves are formed and field oxidation is performed by self alignment for the purpose of retaining the advantages of the method of isolation by forming grooves and of the method of isolation by selective isolation while eliminating defects of these methods.

According to one aspect of this invention, there is provided a substrate structure of a semiconductor device comprising a silicon substrate; an element region selectively formed on the silicon substrate and a relatively thick field oxide region formed adjacent to the element region; an element isolating region formed between the element region and the field oxide region; the element isolating region being in direct contact with the field oxide region; the element isolating region being provided with a relatively deep groove formed in the silicon substrate and having a relatively small width; a silicon oxide insulating film formed on the inner wall of the groove; and a silicon nitride insulating film deposited on the silicon oxide insulating film; wherein surfaces of the element region, the element isolating region and the field oxide region on the silicon substrate are formed substantially flat.

According to another aspect of this invention there is provided a method of manufacturing a substrate structure of a semiconductor device comprising the steps of (a) forming a multilayer pattern region of a predetermined pattern on a substrate, the layers of the pattern having different etching characteristics; (b) forming a first film having a predetermined thickness on the substrate formed with the pattern region, (c) etching the first film with a directive etchant so as to form a first film region having a width substantially corresponding to the thickness of the first film, adjacent to the pattern region, (d) exposing a portion of the surface of the substrate other than those underlying the pattern region and the first film region, (e) forming an etching mask layer on the exposed portion of the substrate, the etching mask layer having different etching characteristic from the substrate, (f) exposing a portion of the surface of the substrate underlying the first film region and etching the exposed surface of the substrate with a directive etchant to form a relatively deep groove for an element isolating region, the groove having a relatively small width, (g) forming an oxidized insulating film and an oxidation preventing layer on the inner wall of the deep groove, and (h) oxidizing a portion of the surface of the substrate opposing the groove, thus forming a field oxide film, the oxidizing starting from a portion about one half of the thickness of the field oxide film, the surfaces of the element region, the element isolating region and the field oxide region being substantially flat.

BRIEF DESCRIPTION OF THE DRAWINGS

In the accompanying drawings

FIGS. 4a to 4g show different steps of still another modification of this invention;

DESCRIPTION OF THE PREFERRED EMBODIMENTS

Figure 1A:
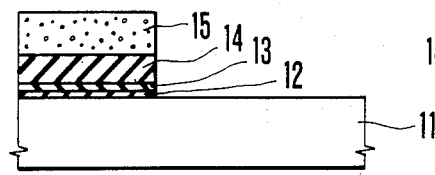
FIGS. 1a through 1g are sectional views showing one embodiment of the method of manufacturing a substrate structure according to this invention.

FIGS. 1a through 1g show successive steps of manufacturing a substrate structure of a semiconductor device according to the method of this invention. As shown in FIG. 1a, a thermal oxidized silicon film ($SiO_2$) 12 having a thickness of 50 nm, for example, is formed on a silicon substrate 11 and a silicon nitride ($Si_3N_4$) film 13 having a thickness of about 150 nm is formed on the thermal oxidized silicon film 12 by a CVD process (Chemical Vapor Deposition) or the like. On the film 13 is formed an oxide silicon film 14 having a thickness of about 600 nm by the CVD process. Then, a photo-resist layer 15 of a predetermined pattern is applied onto the film 14 and by using the photoresist as a mask, films 14, 13 and 12 are sequentially subjected to reactive etchant, until the substrate 11 is exposed to form interelement isolation pattern shown in FIG. 1a.

Figure 1B:
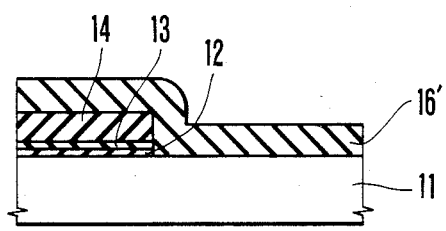

Then as shown in FIG. 1b, after removing the photoresist 15, a silicon nitride layer 16' having a thickness of about 300 nm is formed to cover the entire surface by reduced pressure CVD process, for example.

Figure 1C:
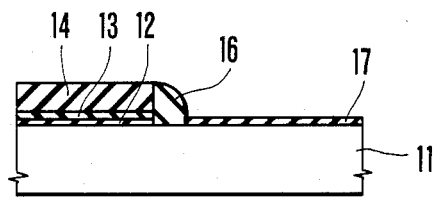

Then as shown in FIG. 1c a silicon nitride region 16 is formed by subjecting the silicon nitride layer 16' to reactive ion etching process using $CF_4$ gas, for example, until the substrate 11 is exposed. Since reactive ion etching process is used, the flat portion of the silicon nitride layer 16' is removed, so that only the vertical portion along the wall of the interelement isolation pattern is left as the region 16. The width of the silicon nitride region 16 formed along the edge of the pattern is substantially equal to the film thickness of the silicon nitride layer 16', that is about 300 nm. Actually, however, the thickness of the silicon nitride film 16' is varied to a range between 100 nm and 500 nm when the silicon nitride region 16 is thermal oxidized under this state. A silicon oxide film 17 having a thickness of about 300 nm is formed.

Figure 1D:
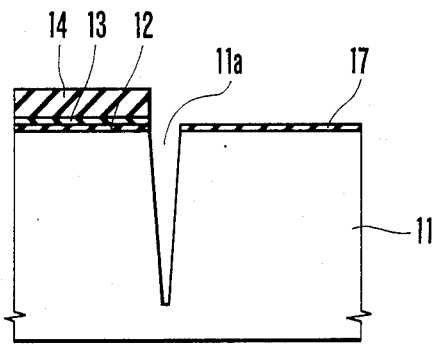
Figure 2:
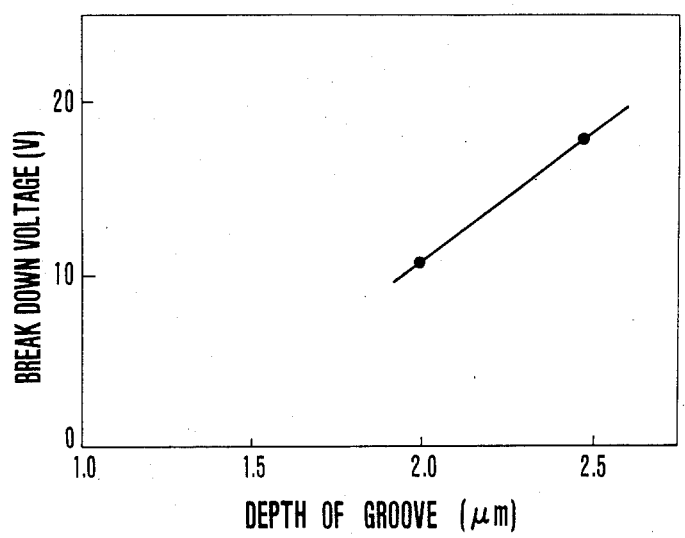
FIG. 2 shows the relation between the depth of the groove formed in accordance with this invention and the break down voltage.

The silicon oxide film 17 is used as a mask for etching the silicon substrate 11. Then, as shown in FIG. 1d, after removing the silicon nitride region 16 by wet etching utilizing phosphoric acid or the like, the silicon substrate 11 is etched by about 3 microns with reactive etching process utilizing $SiCl_4$ gas, for example to form a groove 11a. The depth of the groove 11a formed at this time must be determined by taking account of the breakdown voltage which is required for separating elements in this part. FIG. 2 shows a relationship thereabout. The silicon substrate used for obtaining these characteristics is n epitaxial layer on a $n^+$ doped layer on the surface of $p^+$ silicon crystal with the orientation [III]. After forming the groove, a channel cut region may be formed at the bottom of the groove by ion implantation, for example.

Figure 1E:
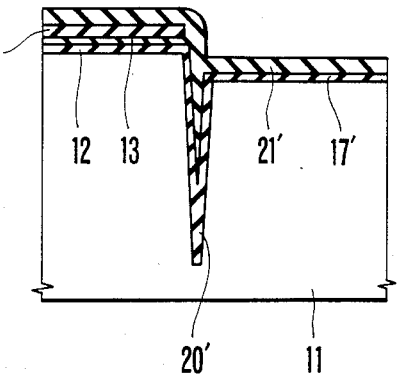
Figure 1F:
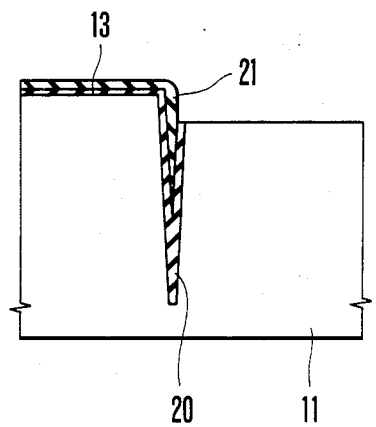
Figure 1G:
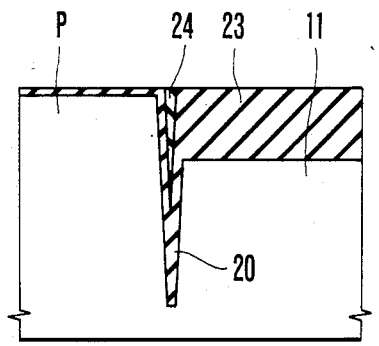

Then as shown in FIG. 1e, the oxide film 17 on the silicon substrate 11 is removed by etching, and the portion of the silicon substrate 11 underlying the oxide film 17 is etched by a thickness corresponding to ½ of that of the field oxide film to be formed later. Then a thermal oxidized film 20' and 17' having a thickness of about 200 nm, and a silicon nitride film 21' having a thickness of about 200 nm is formed by reduced pressure CVD process. Then, as shown in FIG. 1f, the silicon nitride film 21' is entirely removed by reactive ion etching process, and the oxide film 17' is removed by wet etching process. Then, as shown in FIG. 1g, the silicon substrate is selectively oxidized to form a field oxide film 23. As is well known, the term "field oxide film" means an oxide film formed by oxidizing not only the surface portion of the substrate but also a substantial depth thereof as shown in FIG. 1g. At this time, propagation of oxidation in the lateral direction is prevented by silicon nitride film 21 which also prevents formation of a bird's beak.

Accordingly, it is possible to provide a substrate having a thick field oxide film 23 directly in contact with the isolating groove. Since etching is made by taking into consideration the increase in the film thickness at the time of oxidizing the substrate, the upper surface of the field oxide region, the isolation groove and the element region would have an expected construction. Reference numeral 24 shows a portion remaining after the silicon nitride layer 13 has been etched. Thus, an element region P is selectively defined by the field oxide film 23 and element isolating regions 20 and 24.

When the silicon oxide film 17 is formed at the step shown in FIG. 1c, since a thick silicon nitride region 16 is used as a mask when a film having a thickness larger than 0.75 micron is formed with wet oxidation at a temperature of 900° C., a crystal defect may be formed in the silicon substrate 11. To avoid this, a method shown in FIGS. 3a and 3c is used.

Figures 3A, 3B:
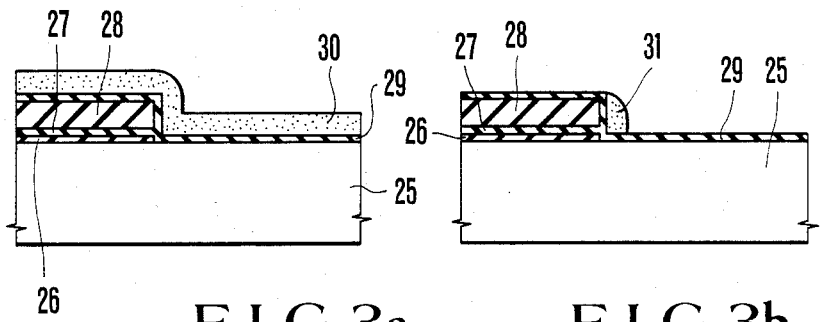
FIGS. 3a to 3c show different steps of a modified embodiment of this invention.

After obtaining the structure shown in FIG. 1a, the resist pattern 15 is removed, a silicon nitride film 29 is formed on the entire surface, and then a polycrystalline silicon layer 30 is formed to obtain the structure shown in FIG. 3a.

Figure 3C:
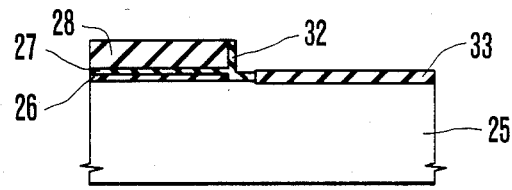

In the modified method shown in FIGS. 3a to 3c, a heat oxide silicon film 26, a silicon nitride film 27 formed by CVD technique, a silicon oxide film 28 formed by CVD technique are formed in the left hand portion of a silicon substrate 25. On the right hand portion of the substrate 25 is formed a silicon nitride film 29 formed by reduced pressure CVD process, for example, and having a thickness of less than 500 angstroms. A polycrystalline silicon layer 30 formed by reduced CVD process is deposited on the silicon nitride film 29 and the silicon oxide film 28. By using films 29 and 30 instead of thick silicon nitride region 16 shown in FIG. 1c, as a thin silicon nitride film 32 is used at the time of forming the silicon oxide film 33, it is possiblie to prevent formation of crystal defects in the silicon substrate. In this case, the polycrystalline silicon film 30 may be substituted by any other film having excellent step or edge covering property. For example, an oxide film formed by the CVD process, a metal film as sputtered aluminum film, or such high polymer film as a photoresist film can be used. Then as shown in FIG. 3b, the polycrystalline film 30 shown in FIG. 3a is etched off except an edge portion 31. Then, as shown in FIG. 3c, the exposed silicon nitride layer 29 is removed by a reactive ion etchant, and a portion 32 covered by the polycrystalline silicon film 31 is left, and thereafter the film 31 is removed. Then, a thermal oxidized silicon film 33 is formed by using the silicon nitride film 32 as a mask. The silicon nitride film 32 at the edge may be constituted by any selective oxidation mask. Furthermore, where the oxide film is formed by plasma oxidation or anodic oxidation, the silicon nitride film can be substituted by an alumina film.

Where a photolithographic etching is possible with a fine pattern, a shallow isolating groove having a depth of less than 1 micron as shown in FIGS. 4a to 4g can be formed concurrently with formation of a deep groove having a depth of more than 2 microns and a field oxide film thicker than 1 micron as shown in FIG. 2.

More particularly, as shown in FIG. 4a a thermal oxidized silicon film 35, a silicon nitride film 36 and a CVD silicon oxide film 37 are sequentially formed on a silicon substrate 34 in the order mentioned. Then after applying a photoresist film, the silicon oxide film described above is etched off by a conventional method for forming a groove A having a width of 0.5 micron and an edge or step B. Thereafter, as shown in FIG. 4a, a silicon nitride film 39 having a thickness of about 30 to 50 nm and a polycrystalline silicon film 40' having a thickness of about 500 nm are sequentially applied. The total thickness H of the silicon oxide film 35, the silicon nitride film 36 and the silicon oxide film 37 on a portion of the surface of the silicon substrate which later becomes an element region should be larger than the width W of the groove. Then as shown in FIG. 4b the flat portion of the polycrystalline film 40' is removed by dry etching except a polycrystalline region at the edge portion B. Then, as shown in FIG. 4c the exposed silicon nitride film 39 is removed by using a polycrystalline silicon film as a mask. Then, as shown in FIG. 4d, a substantial thickness of the polycrystalline silicon film is etched off with a wet etching process to leave only a portion 51 of the polycrystalline silicon film on the surface on which a shallow groove A is to be formed. Then, as shown in FIG. 4e, portions other than an element region and an interelement isolating region are oxidized. At the same time, the inner side of the groove A in the polycrystalline silicon layer 51 is oxidized to form a thermal oxidized silicon film 50 and an oxidized polycrystalline silicon film 52. The silicon oxide film 50 has a thickness of about 0.4 micron, while the silicon oxide film 52 has the same or larger thickness than that of the silicon oxide film 50. After removing the exposed silicon nitride film 39, the assembly is dry etched to form a deep interelement isolating groove 11a having a depth of about 2 microns. Then exposed silicon oxide films 37, 52 and 50 are removed. Since the film 37 is thicker than the other films 52 and 50 a portion thereof is left as a film 41. After removing the silicon nitride film 39 in the shallow groove A the righthand portion of the substrate 34 thus exposed is etched together with the substrate with the bottom of the shallow groove A exposed by an extent a little smaller than ½ of a field oxide film to be formed next.

This state is shown in FIG. 4f. Then an SiO₂ film 45 is formed on the exposed portion of the substrate surface by thermal oxidation. At the same time a silicon nitride film 42 (not shown) is formed followed by reactive ion etching process to leave silicon nitride films 42A and 42B to fill grooves 11a and 11b.

Then as shown in FIG. 4g, a thermal oxidized field film 43 having a thickness of about 1 to 1.5 microns is formed on the exposed surface of the substrate 34. Where grooves 11b and 11a are not completely filled with silicon oxide films, they can be filled with silicon nitride. A modification shown in FIG. 1 can be applied to FIGS. 4a to 4g.

Figure 5:
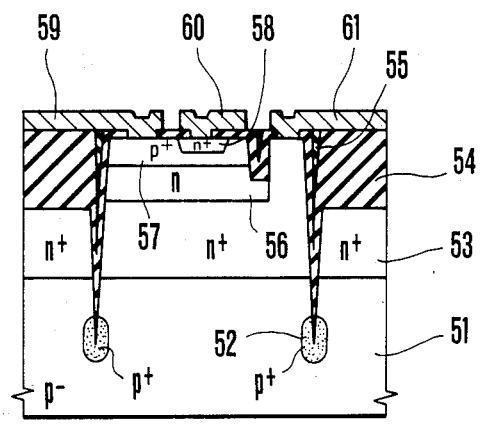
FIG. 5 is a longitudinal sectional view showing a semiconductor device formed by the method shown in FIGS. 4a to 4g.

FIG. 5 shows a semiconductor device completed in a manner described above, in which 51 represents a silicon substrate, 52 a channel cut P+ layer, 53 an n+ layer, 54 a field oxide layer, 55 a silicon nitride layer, 56 an n layer, 57 a P+ layer, 58 an n+ layer, and 59, 60 and 61 base, emitter and collector electrodes respectively.

Since according to the method of this invention a deep groove filled with dielectric and a thick field oxide layer can be formed by self-alignment no bird's beak and bird's head would be formed at the edge of the relatively thick silicon oxide film thus providing an excellent interelement isolation structure for high density intergrated circuits with the thick field oxide film in contact with the deep groove.

Moreover, the width of the pattern is not limitted by the exposure limit of photolithography but can be controlled by the thickness of a film formed by CVD process so that not only this method is suitable for fine construction, but also deep and shallow grooves filled with dielectric and a thick field oxide film can be formed by self alignment. Consequently, the collector compensating region of a bipolar npn transistor constituting an LSI and the base region can be perfectly aligned, thereby providing a structure capable of exhibiting an optimum performances as designed.

Furthermore, according to this invention, it is possible to form with a single pattern, a groove having a narrow width corresponding to the thickness of a film formed by CVD process, a thick oxide film, and a shallow groove about the periphery of an element region. Moreover, a fine isolation structure can be formed having a flat surface and having no difference caused by exchanging patterns. Since the n+ layer pattern becomes unnecessary it is possible to obtain bipolar CMOS and Bi-MOS transistors that can be fabricated into a high speed and high density integrated circuit consuming lesser power. By making flat the substrate surface, there is no breakage of the wiring conductors connected later.

Figure 6A:
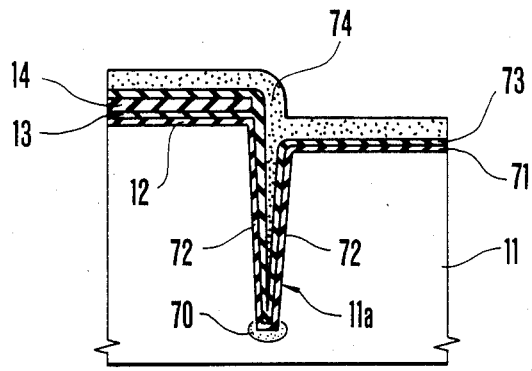
FIGS. 6a to 6c show steps of yet another modification of this invention.
Figure 6B:
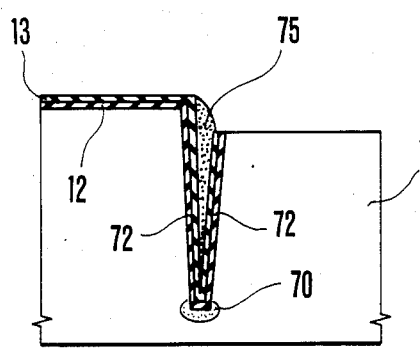
Figure 6C:
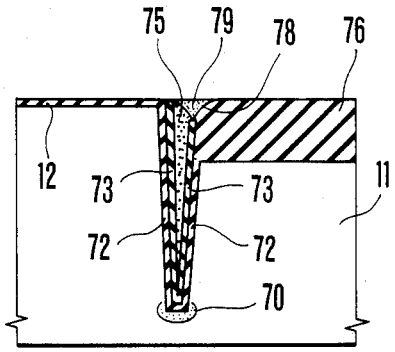

FIGS. 6a through 6c show a modified method of this invention in which the width of the deep groove 11a is increased and the electric charge stored in the insulating film by radiation is decreased when forming an interelement isolating region. In FIGS. 6a to 6c elements corresponding to those shown in FIG. 1a to 1g are designated by the same reference characters. And in the steps shown in FIGS. 6a to 6c, only the portions different from FIGS. 1a to 1g are shown. Steps up to the step shown in FIG. 6a are the same as those shown in FIGS. 1a to 1d, except that the width of the deep groove 11a is made wider than that shown in FIGS. 1a to 1g, by for example 1 micron. Of course, in order to form a groove having larger width, the thickness of the silicon nitride film 16' formed at the step shown in FIG. 1b should be made large, for example about 0.3 microns as described above.

Then as shown in FIG. 6a, near the bottom of the deep groove 11a, a channel cut region 70 is formed by implanting boron ions at a dose of $1 \times 10^{13}/cm^2$ and an accelerating voltage of 30 Kv. Then the $SiO_2$ film on the substrate 11 is etched off and the portion of the silicon substrate 11 underlying this $SiO_2$ film 17 is etched by a depth corresponding to about ½ of a field oxide film to be formed later with reactive ion etching process utilizing $SiC_4$ gas. Then, the exposed surface of the substrate 11 and the inner surface of the groove 11a are thermal oxidized to form $SiO_2$ films 71 and 72 having a thickness of 50 nm, for example. A silicon nitride film 73 having a thickness of 150 nm is formed on the entire surfaces of the $SiO_2$ films 71 and 72 by reduced pressure CVD process. Then a filling member 74 made of polycrystalline silicon semiinsulating material or electroconductive material is formed on the entire surface so as to fill the groove 11a. FIG. 6a shows this state in which the filling member 74 overlies not only the groove 11a but also the silicon nitride film 73.

The materials utilized as the filling member 74 are as follows:
Semiinsulating materials include:
  silicon oxynitride ($Si_xO_yN_z$),
  oxygen-doped polycrystalline silicon, and
  silicon nitride ($Si_xN_y$)
Conductive materials include:
  refractory metals such as molybdenum, tungsten and platinum.

Anyhow, any substance that can discharge electric charge stored in the $SiO_2$ the $Si_3N_4$ film can be used. Consequently the filling member should have a specific resistance of less than about $10^{10}$ ohm·cm. The manufacturing steps of the semiinsulating material is adjusted such that they will have such specific resistivity.

The flat portion of the filling member 74 is then removed with a directive and reactive ion etching process. Consequently, only the portion of the filling material that fills the groove 11a is left. The filled portion 75 has a wedge shape with its upper end rounded.

Then, the exposed portion of the silicon nitride 73 is removed by a reactive etchant. Thereafter, the exposed oxide films 71 and 14 are etched until the upper surface of the substrate 11 is exposed. This state is shown by FIG. 6b. The right hand portion of the silicon substrate 11 at a lower level is exposed while the left hand portion at a higher level is still covered by the silicon oxide film 12 and the silicon nitride film 13.

Then the exposed surface of the silicon substrate 11 is selectively oxidized by pyrogenic oxidation at 900° C., under 8 atmospheric pressure and for 100 minutes to form a field oxide film 76 which is formed to have substantially the same height as the upper surface of the silicon oxide film 12 overlying the silicon substrate 11. Consequently, the upper surface of the silicon substrate is substantially flat.

When forming the field oxide film, since the layer of $Si_3N_4$ is exposed adjacent the groove 11a on the surface of the silicon substrate 11 at a lower level, and since the surface of the filled portion 75 is inclined downwardly toward the right, the field oxide film 76 thus formed completely covers the upper portion of the filled portion 75 so as to form a small recess 78. Accordingly, for the purpose of filling this recess 78, a supplementary filling material such as polycrystalline silicon, semiinsulating material, or electroconductor is applied to cover the entire surface of the substrate. Then the film of the supplementary filling material is etched with directive and reactive ion etchant until the surface of the field oxide film 76 is exposed. Then, as shown in FIG. 6c, the supplementary filling material also fills the recess 78 so that a portion 79 filled with the supplementary material is formed. Thereafter, exposed $Si_3N_4$ film 13 on the portion of the silicon substrate 11 to be used later as the element region is etched off with hot phosphoric acid. For this reason, the groove isolating portion is in direct contact with the thick field oxide film, so that a flat structure can be obtained in which the groove isolating portion, the thick field oxide film and the element region are on the same planes.

The method of utilizing the filling material can also be applied to a method of manufacturing an LSI wherein an $SiO_2$ film 72 and/or $Si_3N_4$ layer 73 can not be made to be thick for some reasons. More particularly, when the width of the opening of the deep groove amounts to 0.5 to 0.6 microns, it is possible to make flat the surfaces of the $SiO_2$ film and the $Si_3N_4$ film without using the filling material when the thicknesses of these films are adjusted more or less. However, due to other limitations of the manufacturing steps there may occur a case in which it is necessary to make thickness of $SiO_2$ to be 500 angstrom and that of the $Si_3N_4$ film to be 1000 angstrom. In such a case, openings having width of 2000 to 3000 angstroms could not be filled with these materials, thus forming recesses. The method described above can be used to fill such recesses.

It should be noted that in the steps shown in FIGS. 6a to 6c, various modifications already described in connection with FIGS. 1a to 1g can also be made.

With the construction described above, by irradiating the insulating film of the element isolating deep groove with radiations, the electric charge stored in the insulating film can be discharged through conductive filling materials 75 and 79 so that component elements utilized in satellites, for example, and required to have high performances can be obtained under severe environment conditions.

With the construction described above since the field oxide film is in direct contact with the element isolating region (deep groove) it is possible to obtain semiconductor devices suitable to be integrated at high densities. Furthermore even when the isolating groove is in direct contact with the thick field oxide film, there is no fear of forming a step such as a bird's beak, thus obtaining a flat substrate structure, which eliminates the possibility of breaking wiring conductors. Since the field oxide film and the element isolating region are separated by a short (not reaching the surface) $Si_3N_4$ film 73, the stress created by the thick field oxide film can be alleviated, thus preventing defects formed in the element region. Accordingly there is no fear of degrading such characteristics as the life of a transistor formed on the element region.

Figure 7A:
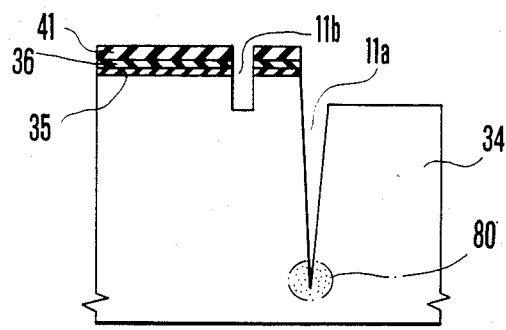
FIGS. 7a and 7b show steps of a further modification of this invention.
Figure 7B:
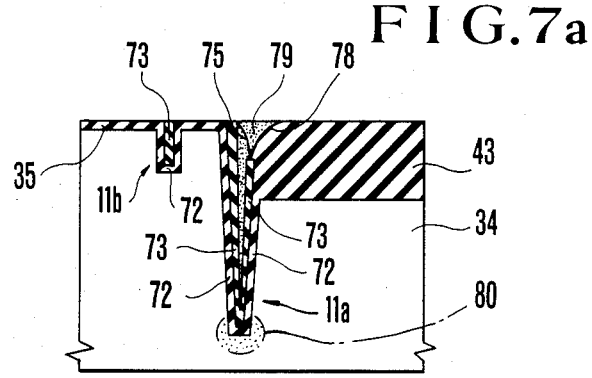

FIGS. 7a and 7b show another modification of this invention in which the method of discharging electric charge from the insulating material shown in FIGS. 6a to 6c is applied to the embodiment shown in FIGS. 4a to 4g in which a deep groove and a shallow groove are formed simultaneously. In this modification, a shallow groove 11b and a deep groove 11a are formed in the same manner as in FIGS. 4a to 4f. Accordingly, at the step shown in FIG. 4f when the shallow groove 11b and the deep groove 11a are formed, a channel cut region 50 is formed at the bottom of the deep groove 11b by ion implantation. This state is shown in FIG. 7a.

Then, the structure as shown in FIG. 7b is formed by the same steps as those shown in FIGS. 6a to 6c. More particularly the entire exposed surface of a silicon substrate 34 is thermal oxidized to form a film of $SiO_2$ having a thickness of 50 nm, for example. Thereafter, a silicon nitride film 73 having a thickness of 100 nm is formed thereon. At this time, the shallow groove 11b is completely filled with the oxide film 72 and the silicon nitride film 73. After that, since filling material 74 as polycrystalline silicon, semiinsulating material, or conductive material is applied onto the silicon nitride film 73. Then the filled material 74 is etched off with directive and reactive ion etching technique to remove the flat portion. After that, the exposed flat silicon nitride film 73 is removed with a reactive etchants. Then the exposed oxide films 71 and 41 are removed until the silicon substrate 34 is exposed. This state is substantially the same as that shown in FIG. 6b except the shallow groove 11b.

The surface of the exposed silicon substrate 34 is selectively oxidized to form a field oxidized film 43 with pyrogenic oxidation at 900° C., under a pressure of 8 atmospheric pressure for 100 minutes. The field oxide film 43 thus formed overlies the silicon substrate 34 and has the same level as that of the oxide film 35 with the result that the upper surface, as a whole, of the silicon substrate 34 is substantially flat.

When forming the field oxide film as above described, since the $Si_3N_4$ layer 73 is exposed adjacent the groove 11a on the surface of the silicon substrate 34 and since the surface of the filled portion 75 is curved downwardly, the field oxide film 76 thus formed can not completely cover the upper portion of the filled portion 75 so that a small recess 78 would be formed. To fill up this recess 78 such supplementary filling material as polycrystalline silicon, semiinsulating material or an electroconductive material is applied to the entire surface of the substrate. The supplementary filling material is etched off with directive and reactive ion etchant until the surface of the field oxide film 71 is exposed. Then as shown in FIG. 7b, also the recess 78 is filled with the supplementary filling material to form a portion 79 filled with the supplementary filling material. After that, the exposed $Si_3N_4$ layer 36 on the silicon substrate 34 to be used later as the element region is etched off with hot phosphoric acid. In this manner, a flat structure can be obtained including a groove isolating portion, a thick field oxide film and an element region, all lying in the same plane.

Figure 8:
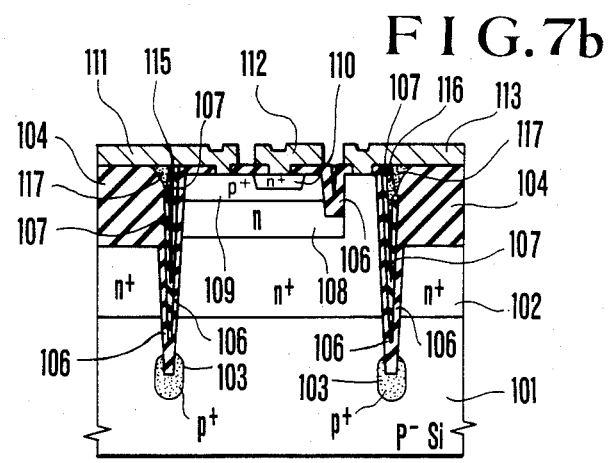
FIGS. 8 and 9 are vertical sectional views showing semiconductor devices manufactured by the methods shown in FIGS. 7a and 7b respectively.
Figure 9:
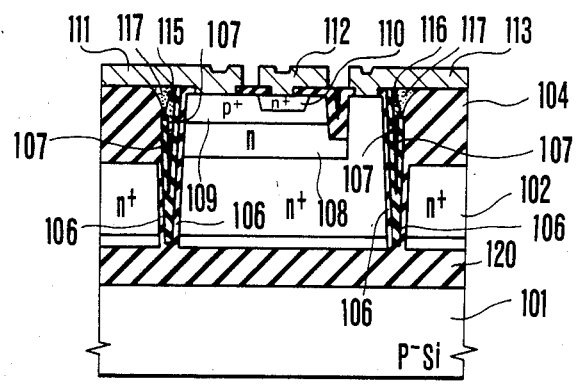

FIGS. 8 and 9 show bipolar transistors prepared by conventional method after removing the oxide film on the surface of the element region by using the method shown in FIGS. 7a and 7b. Of course, the method of this invention can also be applied to form such semiconductor elements as MOS and MOS transistors. In FIGS. 8 and 9, 101 represents a P$^-$ silicon substrate having a resistivity of 10 to 20 ohm cm and a (111) crystal structure, 102 an n$^+$ embedded layer on the substrate 101 and having a surface impurity concentration of about $1 \times 10^{19}/cm^3$, 103 a P$^\pm$ channel cut region, 104 a filled oxide film having a thickness of about 1 micron, 106 oxide films formed on the inner walls of the deep and shallow grooves for isolating the element, 107 a silicon nitride film overlying the oxide films 106, 108 an n type epitaxially grown layer having an impurity concentration of about $1 \times 10^{16}/cm^3$, 109 a P$^+$ diffused layer having an impurity concentration of about $1 \times 10^{18}/cm^3$, 110 a n$^+$ diffused layer having an impurity concentration of $1 \times 10^{18}/cm^3$, 111 to 113 base, emitter and collector electrodes respectively, 115 and 116 a filling material, 117 supplementary filling material, 120 an embedded insulating layer formed on the silicon substrate 101. The embedded insulating layer 120 can be formed by using an insulating substrate instead of the silicon substrate.

With the constructions shown in FIGS. 8 and 9, the insulating strength between elements is more than about 3 times of the operating voltage. The characteristic shown in FIG. 2 shows that with a groove depth of more than 2.5 microns, a reverse breakdown voltage of higher than 20V can be obtained. Moreover, the width of the groove is considerably narrower than that of the prior art element isolating groove, thus enabling to obtain an LSI of high denisty.

It should be understood that the invention is not limited to the specific embodiments described above and that various variations and modifications will be obvious to one skilled in the art.

Figure 10:
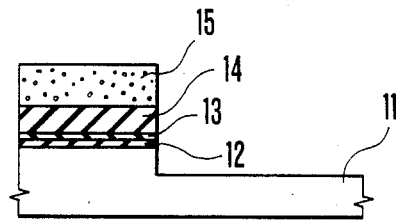
FIGS. 10 and 11 are sectional views showing still other modifications of this invention.

For example, in the embodiment shown in FIGS. 1 to FIG. 1g, after forming a deep groove, although the surface portion of the silicon substrate at which the field oxide film is to be formed is etched off by a thickness corresponding to about ½ of that of the field oxide film to be formed later, it is also possible to etch the exposed surface of the silicon substrate 11 by a thickness corresponding to about ½ of that of the field oxide film to be formed to obtain a construction shown in FIG. 10 so as to execute the steps following the step shown in FIG. 1b. In such case, the etching step of the exposed surface of the silicon substrate shown in FIG. 1e becomes unnecessary.

Figure 11:
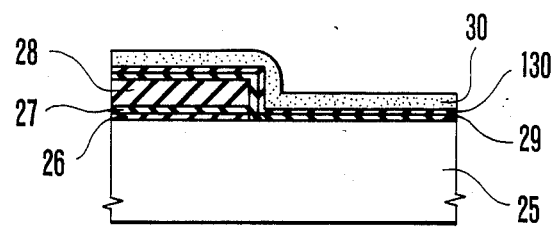

FIG. 11 shows a modification of the construction shown in FIG. 3a which further comprises an $SiO_2$ film 130 having a thickness of 70 nm and interposed between the silicon nitride film 29 and the polycrystalline silicon film 30. Such multilayer insulation structure can be used, if desired, in the manufacture of semiconductor devices.

The filling material utilized in FIGS. 6a to 6c can be replaced by a simple insulating material such as $SiO_2$ formed by CVD technique where it is not necessary to have a discharge property.

As the etchant, a reactive ion etchant is usually used but any other etchant may be used so long as it has a directivity.

Although in the foregoing embodiments sectional views were shown and portions thereof have been described, it should be understood that there are many other combinations of the element region, the isolating layer and the field oxide region. For example, when FIG. 1g is depicted as a plan view, the isolating groove surrounds the element region, and the field oxide film, the other isolating groove and the other element region are arrayed in X direction in the order mentioned, whereas in Y direction, the other element region is positioned closely only via the isolation layer. In another combination, the isolating groove and the field oxide film surround the element region in both X and Y directions, and the other isolating groove and the other element region are positioned on the outside of the field oxide film.

Of course, many other combinations can be considered. In any combination, the element region, the deep region and the thick oxide region should be formed closely adjacent.

What is claimed is:

1. A substrate structure of a semiconductor device comprising:
   a silicon substrate;
   an element region selectively formed on said silicon substrate; and
   a relatively thick field oxide region formed adjacent to said element region; and
   an element isolating region formed between said element region and said field oxide region, said element isolating region being in direct contact with said field oxide region; and
   said element isolating region being provided with a relatively deep groove of greater than two micrometers formed in said silicon substrate and having a relatively small width of less than one micrometer, and the thickness of said field oxide region being of the same order of magnitude as the depth of said groove; and
   a silicon oxide insulating film formed on the inner wall of said groove; and
   a silicon nitride insulating film disposed on said silicon oxide insulating film; wherein surfaces of said element region, the element isolating region and the field oxide region on said silicon substrate are formed substantially flat.

2. The substrate structure according to claim 1 wherein said element isolating region includes a filling material, filling said recess defined by an inner side of said silicon nitride insulating film, said silicon oxide and silicon nitride film and said filling material being selected to prevent defects in said silicon substrate, and wherein a portion of said silicon nitride film in contact with said field oxide region is at a lower level than a portion of said silicon nitride film in contact with said element region.

3. The substrate structure according to claim 1 which further comprises a doped channel cut region formed over a bottom of said deep groove.

4. The substrate structure according to claim 2 wherein said filling material comprises an electroconductive material capable of discharging electric charge in the adjacent insulating film.

5. The substrate structure according to claim 4 wherein said filling material is selected from the group consisting of polycrystalline silicon, semiinsulating materials and electroconductive materials.

6. The substrate structure according to claim 1 wherein a bottom of said deep groove reaches an insulating region embedded in said silicon substrate or an insulating substrate supporting said silicon substrate.

* * * * *